United States Patent
Hwang et al.

[11] Patent Number: 5,838,062
[45] Date of Patent: Nov. 17, 1998

[54] CORROSION-RESISTANT LEAD FRAME

[75] Inventors: Ki Youn Hwang; Hee Suck Kim; Jae Won Lee, all of Asan-gun, Rep. of Korea

[73] Assignee: Samsung Electronics Co., Ltd., Suwon, Rep. of Korea

[21] Appl. No.: 625,517

[22] Filed: Mar. 26, 1996

[30] Foreign Application Priority Data

Oct. 12, 1995 [KR] Rep. of Korea .................. 1995-35095

[51] Int. Cl.⁶ .......................... H01L 23/495; H01L 23/48; H01L 23/52; H01L 29/40
[52] U.S. Cl. .......................... 257/666; 257/741; 257/750; 257/762; 257/736
[58] Field of Search .................................. 257/666, 736, 257/741, 750, 753, 762

[56] References Cited

U.S. PATENT DOCUMENTS 4,707,724  11/1987  Suzuki et al. ........................... 257/766
5,343,073  8/1994   Parthasarathi et al. .................. 257/707
5,459,103  10/1995  Kellecher et al. ....................... 257/666
5,540,378  7/1996   Mahulikar et al. ...................... 257/677

*Primary Examiner*—Teresa Maria Arroyo
*Attorney, Agent, or Firm*—Cushman Darby & Cushman Intellectual Property Group of Pillsbury Madison & Sutro LLP

[57] ABSTRACT

A lead frame for a semiconductor chip package, including a die pad onto which a semiconductor chip will be attached; leads which will be electrically connected to the chip; and side rails supporting the leads and the die pad; a second metal being contact with the rails, this second metal having a higher standard electrode potential than that of the copper metal or alloy of which the remainder of the lead frame is made.

6 Claims, 6 Drawing Sheets

CORROSION-RESISTANT LEAD FRAME

BACKGROUND OF THE INVENTION

1. Field of the Invention

The present invention relates generally to a semiconductor chip package, and in particular to a method for reducing oxidation of a lead frame in a semiconductor chip package.

2. Description of the Related Art

In a semiconductor chip package which includes a body of molded-in-place plastic material, a lead frame serves primarily to support a semiconductor chip mechanically during assembly of the package, and to connect the chip electrically with the outside world. The lead frame comprises a die pad onto which a chip is attached and leads for electrically connecting the chip to the external electrical terminals of the chip. FIG. 1 of the attached drawings depicts a conventional lead frame strip for semiconductor chip assembly. (At a later stage, the strip is severed into a plurality of individual lead frames.)

With reference to FIG. 1, the structure that will become each individual lead frame, in the lead frame strip (10) includes a die pad (1) onto which a chip will be attached, tie bars (2) for supporting the die pad (1), inner leads (3) to be connected to the chip through gold wires, outer leads (4) for electrically connecting the chip to external electrical devices, and side rails (5) surrounding the above-described structure and maintaining the shape of the lead frame strip. At least one of the side rails (5) has holes (6) which are used as an indices when the lead frame strip or lead frame is transferred. The double dot-dashed line (at (7) in FIG. 1) indicates the boundary of the central portion of an individual lead frame, which will be disposed within the capsule of molded-in-place plastic material of a respective package body. The part of the lead frame which will be disposed within the package body upon completion of molding, is referred to as its "functional area", whereas the remaining part of lead frame which will protrude from the package body is referred to as its "non-functional area".

Because various demands are placed on lead frame materials during lead frame fabrication, package assembly, and device performance, the lead frame materials are intended to meet certain stringent requirements. These requirements have regard to mechanical strength, thermal and electrical conductivities, stampability, bend-formability, ease of etching and plating, solderability, softening resistance (to prevent damage to leads during high temperature operations such as die attachment, wire bonding, and encapsulation by plastic material), good lead frame-to-epoxy resin adhesion, rigidity, and fatigue resistance.

To meet these requirements, copper alloys and alloy 42 (Nickel alloy) are usually employed as lead frame compositional material. Alloy 42 had been widely used as a lead frame material, in consideration of strength and easiness to stamp. Recently, however, a development in copper materials with the same or similar strength as nickel alloy and a development in forming techniques, makes it possible to use copper alloys as lead frame materials which are capable complying with the stringent requirements. The use of the copper or copper alloy materials has benefits, in that both the thermal conductivity, and the thermal expansion coefficient of a lead frame made thereof are similar to those of the epoxy molding compound used for the capsule; also, a reduction in lead frame production cost is realized by virtue of the comparatively low price of these copper lead frame fabrication materials.

Nevertheless, copper alloy lead frames as heretofore made also have the following disadvantages: they are liable to be oxidized and corroded during storage, resulting in a short shelf life, and, more importantly, during the semiconductor package assembly process, which is usually carried out at high temperature and humidity, an oxide layer is formed on the lead frame surface, causing various package failures, such as ones due to bad adhesion or to delamination between the lead frame and the molding compound, and a decrease in reliability, quality and yield of the package.

To avoid these problems associated with oxidative corrosion of copper alloy lead frames, a solution has been proposed that overall package assembly be carried out in the presence of a nitrogen or hydrogen gas atmosphere, instead of one of air. However, even in such a case, introduction of oxygen into the package assembly lines cannot completely prohibited in actual commercial practice as heretofore known.

SUMMARY OF THE INVENTION

Thus, an object of the invention is to provide an improved lead frame which is free from the above-described problems associated with oxidative corrosion of copper alloy lead frames, while continuing to obtain the benefit of the advantageous properties theoretically inherent in the use of copper alloy for making lead frames.

This object can be accomplished by provision of an improved lead frame for a semiconductor chip package, comprising:

a lead frame for semiconductor chip package comprising:
  a die pad onto which a semiconductor chip will be attached;
  leads which will be electrically connected to the chip;
  side rails supporting the leads and the die pad; and
  a second metal being contact with the rails, the second metal having a higher standard electrode potential than that of the lead frame.

BRIEF DESCRIPTION OF THE DRAWINGS

These and various other features and advantages of the present invention will be readily understood with reference to the following detailed description, taken in conjunction with the accompanying drawings, wherein like reference numerals designate like structural elements, and, in which.

DETAILED DESCRIPTION OF PREFERRED EMBODIMENTS OF THE INVENTION

The present invention will now be described in more detail with reference to FIGS. 2–7 of the accompanying drawings.

An oxide layer is formed via an electrochemical reaction in the presence of oxygen on the surface of a metal as shown in the following reaction equations, and causes chemical corrosion:

Oxidation of metal $M \rightarrow M^{2+} + 2e$

Reduction of oxygen $\frac{1}{2}O_2 + 2e \rightarrow O^{2-}$

Formation of oxide $M^{2+} + O^{2-} \rightarrow MO$

When different metals are in contact with each other or are otherwise effectively galvanically connected to each other, one of these metals serves as an anode while the other serves as cathode, due to the difference in their standard electrode potentials or galvanic series potentials.

The standard electrode potentials and galvanic series potentials of important metals are as follows:
[Standard electrode potentials]
(Cathode) Au—Pt—Pd—Ag—Hg—Cu . . . Zn—Mn—Al—Mg—Be—Na—K (Anode)
[Galvanic series potentials]
(Cathode) Pt—Au—Ag—Cu-Chalcopyrite-Ni . . . Al—Zn—Mg alloy-Mg (Anode)

Figure 2:
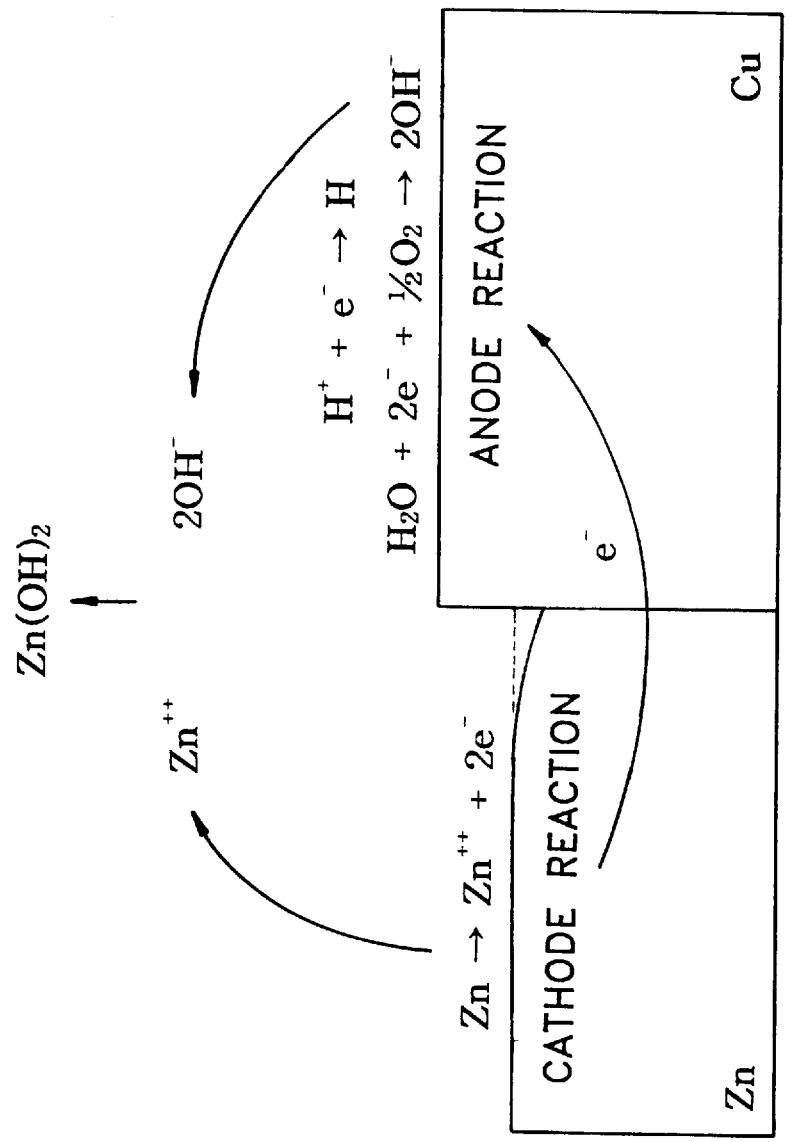
FIG. 2 shows a phenomenon known to occur in Galvanic cells wherein zinc (Zn) and copper (Cu) are in contact with each other.

FIG. 2 is a schematic depiction of dielectric polarization mechanisms at an associated cathode and anode, when zinc (Zn) and copper (Cu) are effectively in contact with each other. Although priority of important metals in the standard electrode potential series is somewhat different from that in the galvanic series, zinc always serves as an anode and copper always serves as a cathode, when zinc and copper are in effectively contact with each other. Since the standard electrode potential is 0.762V for zinc and is −0.345V for copper, zinc releases electrons (undergoes oxidation) to become a zinc ion ($Zn^{2+}$). The electrons released from the zinc move to the copper, and water ($H_2O$) in the air changes to 2 OH⁻, which will react with zinc ions ($Zn^{2+}$) and cause corrosion of the zinc at the boundary between the anode and cathode, i.e., at the dotted-line indicated in FIG. 2.

This phenomenon is called as "sacrificial polarization" since all of electrons needed for the reduction of oxygen in the air are provided from zinc, which has a higher ionization tendency than copper. Such a sacrificial polarization causes oxidative corrosion of the zinc only.

Figure 1:
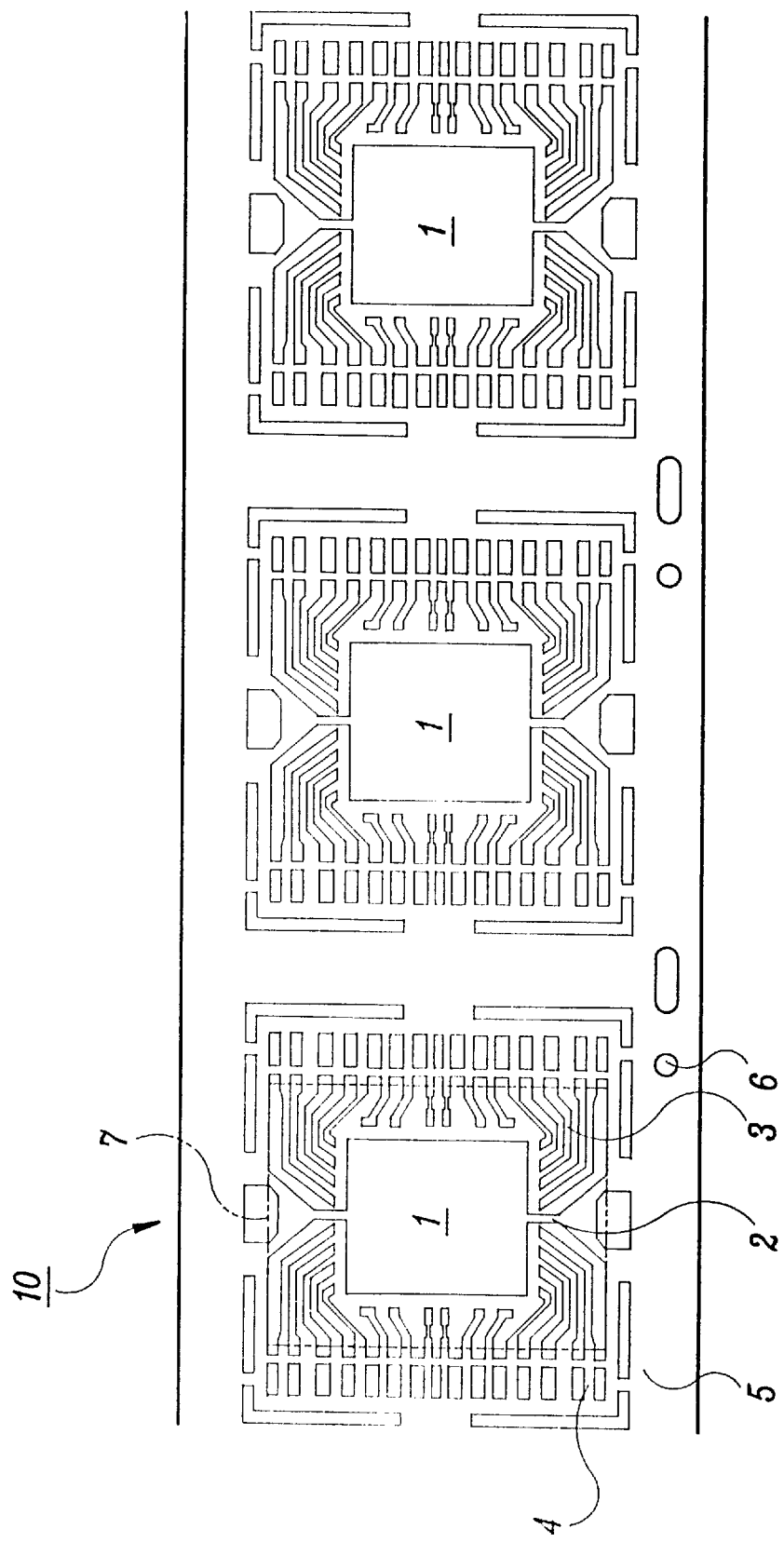
FIG. 1 is a plan view of a conventional lead frame conventionally made from a conventional copper alloy.
Figure 3:
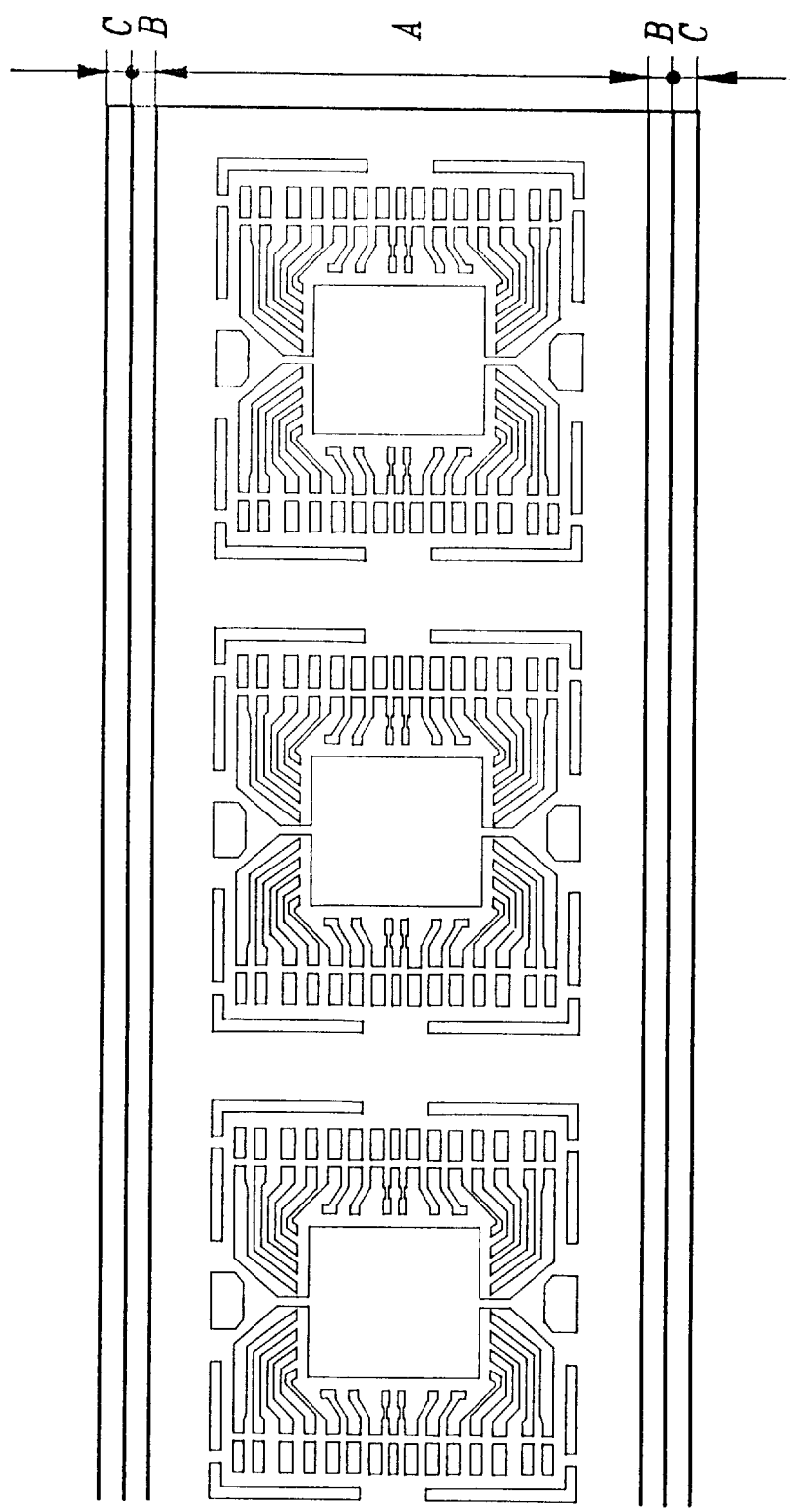
FIG. 3 is a plan view of an embodiment of a lead frame according to the invention.

The lead frame fabricated by employing a sacrifice according to the present invention is shown in FIG. 3. FIG. 3 is a plan view of a lead frame provided in accordance with the principles of the present invention. With reference to FIG. 3, the detailed explanation of the section "A" will be omitted, because it would be substantially the same as that the made in relation to the comparable structure shown in FIG. 1. The lead frame according to the present invention shown in FIG. 3 is different from the conventional one shown in FIG. 1, in that the side rail of the former one of the present invention is greater than that of the later by the amounts respectively contributed by the respective adjoining laterally outer marginal portions "B" and "C".

In one embodiment of the lead frame of the present invention, each inner marginal portion "B" is made from Zn—Cu alloy and each outer marginal portion "C" is made from Zn, while the most medial portion "A" is made from Cu alloy. The Zn—Cu alloy employed in the invention may be any one used in the art.

By fabricating the lead frame partly of Cu—Zn alloy and Zn, which have a greater ionization tendency (i.e., smaller ionization potential) than copper alloy, oxidation of the lead frame is localized to the Zn or Zn—Cu alloy side rail, according to the mechanism as which is discussed above in relation to FIG. 2, thereby inhibiting oxidative corrosion of the copper alloy functional part of the lead frame.

The lead frame as shown in FIG. 3 may be prepared by fabricating Zn or Zn—Cu alloy on the side rails of the lead frame. Alternatively, it may be fabricated by use of powder metallurgy, wherein individual powdered metals, singly or in mixtures thereof, are compressed and sintered, since refining, and cold or hot rolling, which are usually used for the manufacture of conventional lead frames cannot be applied to the fabrication of the lead frame of the present invention.

Figure 4:
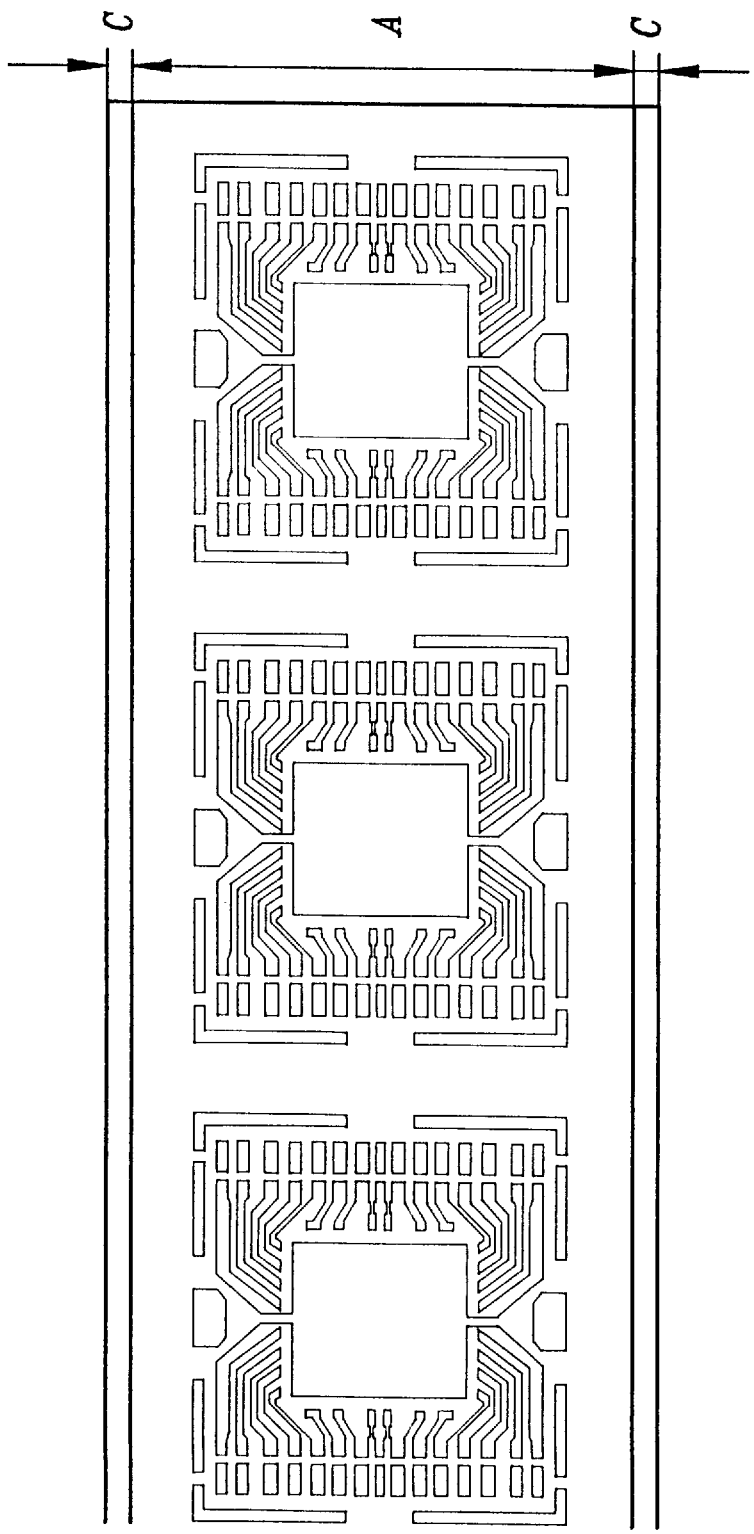
FIG. 4 is a plan view of an another embodiment of a lead frame according to the invention.

FIG. 4 shows an another embodiment of a lead frame according to the present invention. The lead frame in FIG. 4 is the same as that in FIG. 3, except that the side rail part "B" made from a Zn—Cu alloy is omitted at both lateral margins of the copper alloy medial portion. That is to say, the lead frame according to the present invention may have a structures in which the copper alloy is adjacent and directly in contact with the zinc of the respective outer marginal portions.

Figure 5:
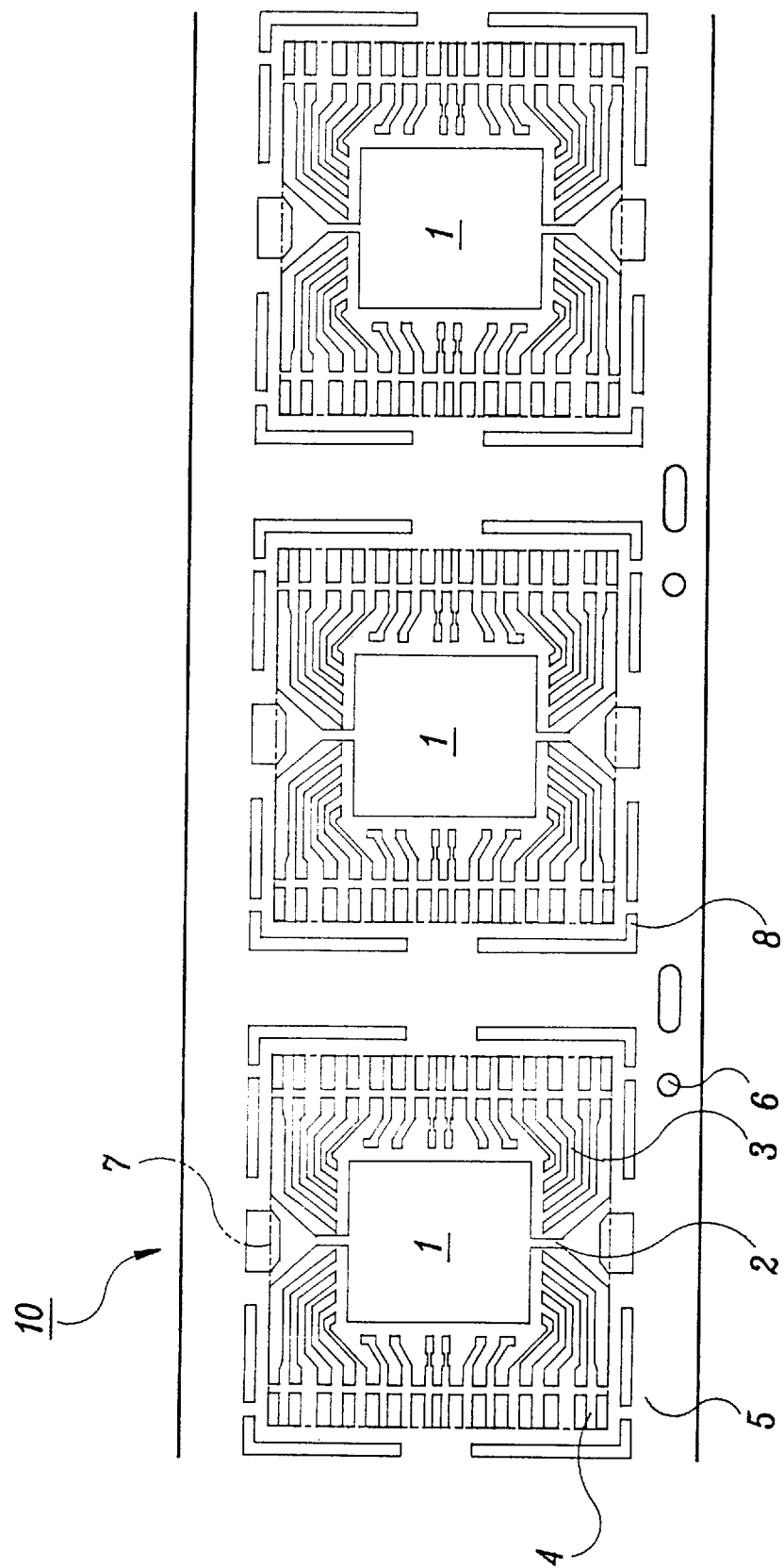
FIG. 5 is a plan view of another embodiment of a lead frame according to the invention, in which the lead frame is coated with zinc(Zn)

FIG. 5 shows another embodiment of a lead frame according to the present invention, wherein the functional and non-functional areas are shown lineated by respective dot-dashed lines. In the lead frame of FIG. 5, there a functional area, comprising a die pad (11), inner (3) and outer (4) leads, tie bars (2); and a non-functional area, comprising dam bars and side rails, wherein the non-functional area is coated with a metal having a higher ionization tendency than the lead frame material, e.g., zinc (Zn) or Zn—Cu alloy. For this embodiment, the Zn or Zn—Cu alloy forms the nonfunctional area between slots and outer leads.

Thus, by positioning the Zn or Zn—Cu alloy in contact with the functional area, which should not oxidized, the problems associated with oxidative corrosion of the copper alloy lead frame can be effectively avoided.

Figure 7:
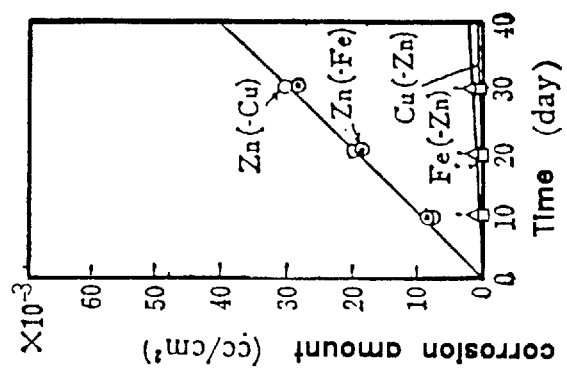
FIG. 7 is a graph showing corrosion of copper(Cu), iron(Fe) and zinc(Zn) in a 3% saline solution when Zn is in contact with Cu, or Zn is in contact with Fe.
Figure 6:
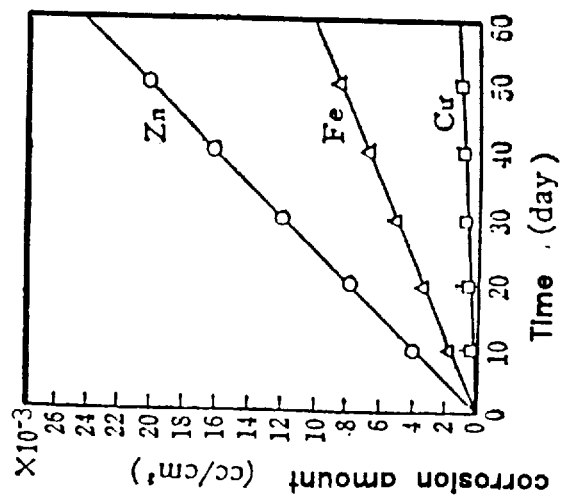
FIG. 6 is a graph showing corrosion of copper(Cu), iron(Fe) and zinc(Zn) in a 3% saline solution.

FIG. 6 and FIG. 7 are graphs showing the corrosion of various metals in a 3% saline solution, when each metal is alone, or two metals thereof are in contact with each other, respectively. The transverse axis indicates time (day) and longitudinal axis indicates corrosion amount ($CC/cm^2 \times 10^3$).

With reference to FIG. 6, the lines -○-, -△- and -□- respectively indicate the corrosion of zinc(Zn), iron(Fe), and copper(Cu), when they are alone. A rapid increase in the corrosion of metals is observed, depending on time.

With reference to FIG. 7, the line -○- shows the corrosion of zinc(Zn) when Zn contacts Cu, the line -⊙- shows the corrosion of zinc(Zn) when Zn contacts Fe. On the other hand, the line -□- shows the corrosion of Cu when Cu contacts Zn, and the line -△- shows the corrosion of Fe when Fe contacts Zn.

As can be seen from FIG. 7, the corrosion of zinc is significantly greater than that of copper when these two metals contact each other, because oxidation is localized to the zinc.

As described above, it is possible to inhibit oxidative corrosion of lead frames by making a lead frame which is composed of more than one metal, wherein one metal having a greater ionization tendency is used for providing a selected portion, compared with that of another metal used for another portion, i.e., for contacting the non-functional side rails to the functional part. According to the present invention, the amount (area) of corrosion of a lead frame occurring during the chip package assembly process, in particular, die attachment, bonding of a chip to inner leads of the lead frame, and molding, can be decreased about 10%, compared to the corrosion occurring during accomplishment of the corresponding steps in the manufacture of a package comprising a conventional lead frame.

Although only two embodiments wherein the non-functional part of the lead frame is made at least in part from Zn in particular are described herein, it will be apparent to the ordinary skilled person in the art that other metals with a greater ionization tendency than that of the medially disposed metal having a lesser ionization tendency also may be employed.

Although preferred embodiments of the present invention have been described in detail hereinabove, it should be clearly understood that many variations and/or modifications of the basic inventive concepts herein taught which may appear to those skilled in the art will still fall within the spirit and scope of the present invention as defined in the appended claims.

What is claimed is:

1. A lead frame for a semiconductor chip package, comprising:

a die pad configured to have a semiconductor chip attached thereto;

a plurality of leads configured to be electrically connected to the chip;

two laterally opposite side rails supporting said leads and said die pad;

said die pad, leads and side rails being integrally provided on a body of a first metal having a first, given standard electrode potential; and a second metal provided on said side rails in effective galvanic contact with the said side rails and having a higher standard electrode potential than that of said first metal.

2. The lead frame of claim 1, wherein:

said first metal is a copper alloy and said second metal is zinc.

3. The lead frame of claim 1, wherein:

a copper-zinc area is provided on each side rail between and said die pad and said second metal, and directly contacting said second metal.

4. A lead frame for a semiconductor chip package, comprising:

a die pad configured to have a semiconductor chip attached thereto;

a plurality of leads configured be electrically connected to the chip;

a plurality of side rails supporting said leads and said die pad;

said die pad, leads and side rails being integrally provided on a body of a first metal having a first, given standard electrode potential; and a second metal coated on a non-functional area of the lead frame and having a higher standard electrode potential than that of the first metal, said second metal being located so as to lie outside a medial region where, following attachment of a semiconductor chip on said die pad, the semiconductor chip, die pad and inner end portions of said leads are to become encapsulated by a body of molded-in-place plastic material.

5. The lead frame of claim 4, wherein:

said second metal is zinc and the first metal is a copper alloy.

6. The lead frame of claim 5, wherein:

said non-functional area further includes a plurality of dam bars.

* * * * *